US012101901B2

(12) United States Patent
Lee et al.

(10) Patent No.: US 12,101,901 B2
(45) Date of Patent: Sep. 24, 2024

(54) ELECTRONIC DEVICE INCLUDING HOUSING AND METHOD FOR MANUFACTURING THE HOUSING

(71) Applicant: Samsung Electronics Co., Ltd., Suwon-si (KR)

(72) Inventors: Yoonhee Lee, Suwon-si (KR); Hangyu Hwang, Suwon-si (KR); Junghyun Im, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 328 days.

(21) Appl. No.: 17/590,039

(22) Filed: Feb. 1, 2022

(65) Prior Publication Data

US 2022/0248551 A1    Aug. 4, 2022

Related U.S. Application Data

(63) Continuation of application No. PCT/KR2022/000726, filed on Jan. 14, 2022.

(30) Foreign Application Priority Data

Jan. 29, 2021    (KR) .................. 10-2021-0012844

(51) Int. Cl.
*H05K 5/00*     (2006.01)
*G06F 1/16*     (2006.01)
(Continued)

(52) U.S. Cl.
CPC ......... *H05K 5/0243* (2013.01); *G06F 1/1656* (2013.01); *H01Q 1/243* (2013.01); *H04M 1/0283* (2013.01)

(58) Field of Classification Search
None
See application file for complete search history.

(56) References Cited

U.S. PATENT DOCUMENTS 10,827,632 B2 *    11/2020   Huang ................. H05K 5/0017
2015/0245513 A1     8/2015   Moon
(Continued)

FOREIGN PATENT DOCUMENTS

CN    106659016 A    5/2017
CN    110662376 A    1/2020
(Continued)

OTHER PUBLICATIONS

International Search Report and Written Opinion of the International Searching Authority dated May 2, 2022, in connection with International Application No. PCT/KR2022/000726, 13 pages.

*Primary Examiner* — Anthony Q Edwards
*Assistant Examiner* — Rashen E Morrison

(57) ABSTRACT

Various embodiments of the present disclosure relate to an electronic device including a housing and a method of manufacturing the housing. The electronic device includes a housing forming an exterior of the electronic device. The housing is constituted to include a non-conductive part including a non-conductive protrusion protruded from at least some area of the non-conductive part, a conductive deposition layer disposed on a top surface of the non-conductive part except on the non-conductive protrusion, and a decoration layer formed on the top of the conductive deposition layer. Accordingly, the housing is lightweight and can perform a function of an antenna radiator. Other various embodiments are possible.

19 Claims, 11 Drawing Sheets

(51) Int. Cl.
  *H01Q 1/24* (2006.01)
  *H04M 1/02* (2006.01)
  *H05K 5/02* (2006.01)

(56) References Cited

U.S. PATENT DOCUMENTS

2016/0204502 A1    7/2016  Misra et al.
2016/0227655 A1    8/2016  Han et al.
2017/0373377 A1   12/2017  Gagne-Keats
2021/0013446 A1*   1/2021  Lee .................. H10K 50/84

FOREIGN PATENT DOCUMENTS

| KR | 10-1137988 B1 | 4/2012 |
| KR | 10-1300953 B1 | 8/2013 |
| KR | 10-1609375 B1 | 4/2016 |
| KR | 10-2016-0088709 A | 7/2016 |
| KR | 10-2016-0094155 A | 8/2016 |
| KR | 10-1745949 B1 | 6/2017 |
| KR | 10-2163406 B1 | 10/2020 |

* cited by examiner

ELECTRONIC DEVICE INCLUDING HOUSING AND METHOD FOR MANUFACTURING THE HOUSING

CROSS-REFERENCE TO RELATED APPLICATIONS

This application is a continuation of International Application No. PCT/KR2022/000726 filed on Jan. 14, 2022, which claims priority to Korean Patent Application No. 10-2021-0012844 filed on Jan. 29, 2021, the disclosures of which are herein incorporated by reference in their entirety.

BACKGROUND

1. Field

Various embodiments of the present disclosure relate to an electronic device including a housing and a method of manufacturing the housing.

2. Description of Related Art

The use of a portable electronic device, such as a smartphone, a notebook, or a tablet PC, is increased, and various functions are provided to the electronic device.

The portable electronic device may include a metal housing formed along an outside edge thereof.

The metal housing can protect constituent elements, such as a printed circuit board, a camera module, and/or a sensor circuit disposed within the portable electronic device.

The metal housing may be separated through at least one slit and used as a plurality of antenna radiators.

A smartphone, that is, a kind of portable electronic device, may include a bar type, a foldable type, a rollable type, or a wearable type.

The outside of the portable electronic device may be constituted by using a metal housing in order to protect constituent elements disposed within the portable electronic device. If the outside of the portable electronic device is constituted by using the metal housing, it may be inconvenient to carry the portable electronic device and a manufacturing cost may be increased because the portable electronic device becomes heavy.

If at least a part of the metal housing is separated through a slit and used as antenna radiators, the slit needs to be formed through a cutting process. In a process of forming the slit, an uneven and stepped surface may be formed around the slit.

The portable electronic device may need to be lightly manufactured by taking easy portability into consideration and to be flatly manufactured without a stepped surface around the slit.

Various embodiments of the present disclosure may provide an electronic device including a housing which is lightweight and with which a non-conductive protrusion has been integrated and a method of manufacturing the housing.

SUMMARY

An electronic device according to various embodiments of the present disclosure may include a housing forming an exterior of the electronic device. The housing may include a non-conductive part including a non-conductive protrusion protruded from at least some area of the non-conductive part, a conductive deposition layer disposed on a top surface of the non-conductive part except on the non-conductive protrusion, and a decoration layer formed on the top of the conductive deposition layer.

A method of manufacturing a housing of an electronic device according to various embodiments of the present disclosure may include manufacturing a non-conductive part including a non-conductive protrusion protruded from at least some area of the non-conductive part, forming a conductive deposition layer on a top surface of the non-conductive part by using deposition, cutting the non-conductive protrusion so that a top surface of the non-conductive protrusion and a height of the conductive deposition layer are substantially identical with each other, and forming a decoration layer on the conductive deposition layer formed on a top surface of the non-conductive part.

According to various embodiments of the present disclosure, since the conductive deposition layer is formed on a surface of the non-conductive part with which the non-conductive protrusion has been integrated, the electronic device including the housing, which is lightweight, and can perform a function of an antenna radiator can be provided.

In addition, various effects directly or indirectly understood through various embodiments of the present disclosure may be provided.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

In relation to the description of the drawings, the same or similar reference numerals may be used with respect to the same or similar constituent elements, in which in which.

DETAILED DESCRIPTION

Figure 1:
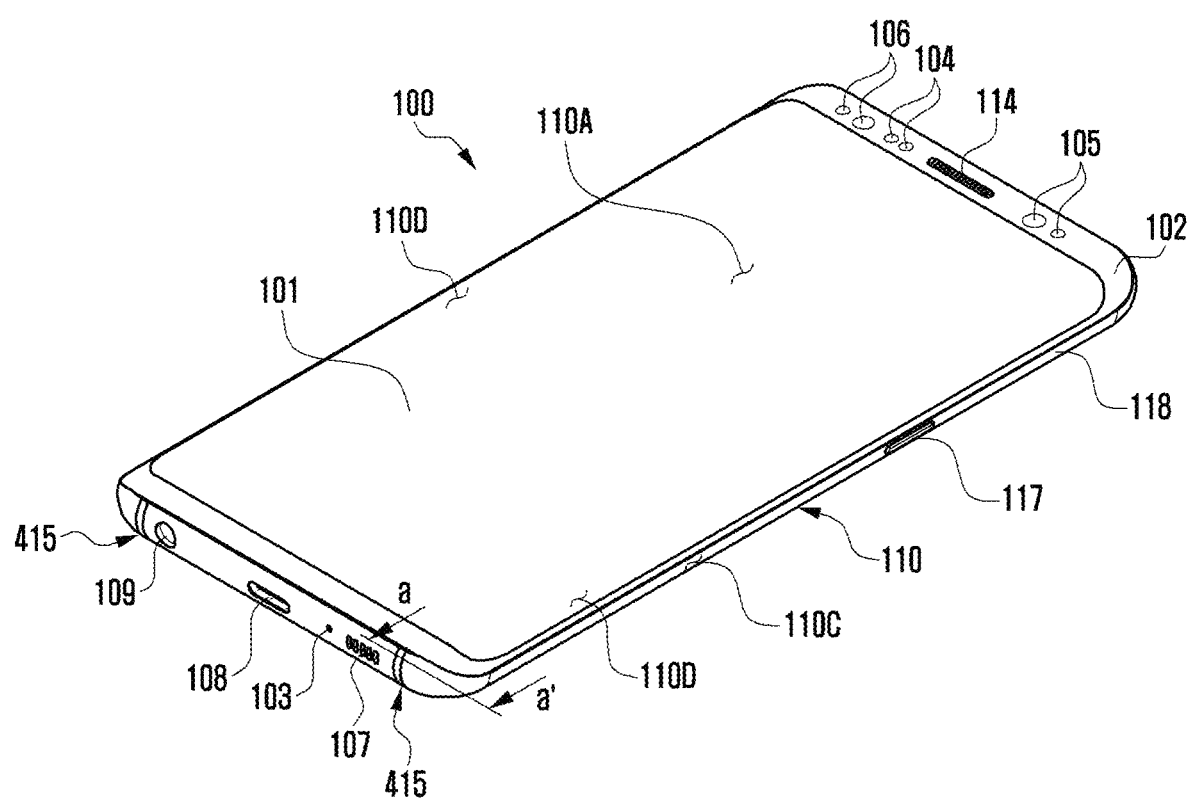
FIG. 1 is a perspective view of the front of an electronic device according to various embodiments of the present disclosure.

FIGS. 1 through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order).

Figure 2:
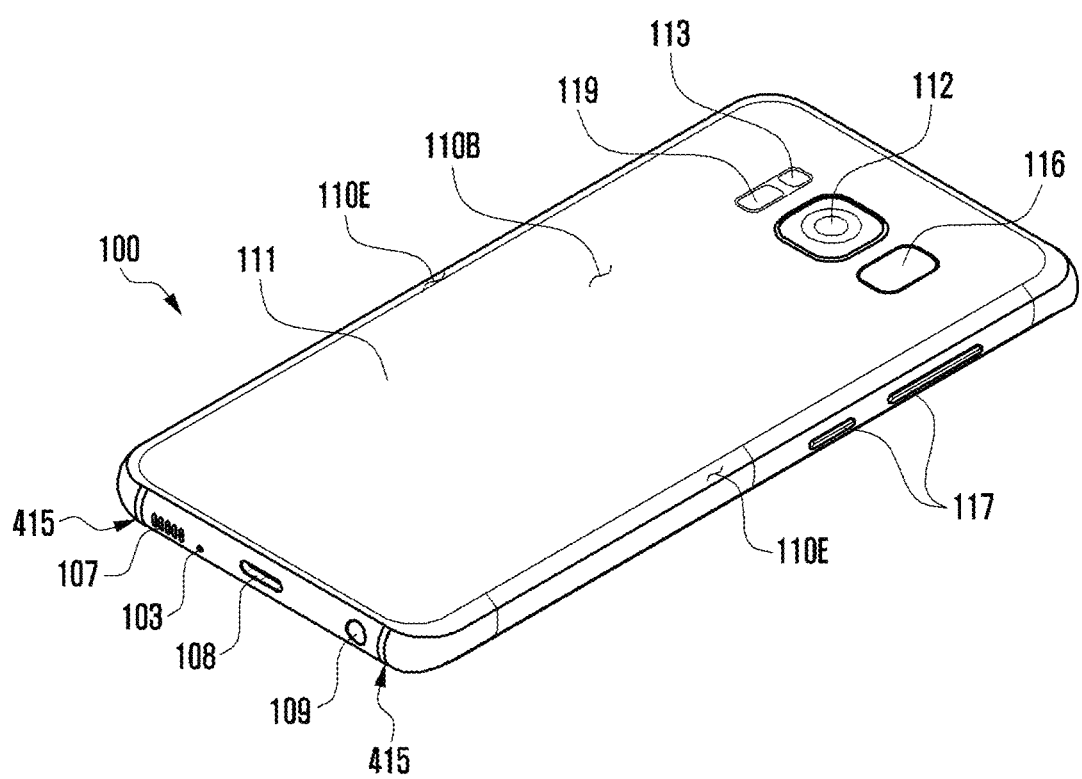
FIG. 2 is a perspective view of the rear of the electronic device according to various embodiments of the present disclosure.

FIG. 1 is a perspective view of the front of an electronic device according to various embodiments of the present disclosure. FIG. 2 is a perspective view of the rear of the electronic device according to various embodiments of the present disclosure.

Referring to FIG. 1 and FIG. 2, an electronic device 100 according to an embodiment may include a housing 110 including a first surface (or front surface) 110A, a second surface (or rear surface) 110B, and a side surface 110C surrounding the space between the first surface 110A and the second surface 110B. In another embodiment (not illustrated), the housing may denote a structure that forms a part of the first surface 110A, the second surface 110B, and the side surface 110C illustrated in FIG. 1. According to an embodiment, the first surface 110A may be formed by a front plate 102, at least a part of which is substantially transparent (for example, a glass plate including various coating layers, or a polymer plate). The second surface 110B may be formed by a rear plate 111 that is substantially opaque. The rear plate 111 may be made of coated or colored glass, ceramic, polymer, metal (for example, aluminum, stainless steel (STS), or magnesium), or a combination of at least two of the above-mentioned materials. The side surface 110C may be formed by a side bezel structure (or "side member") 118 which is coupled to the front plate 102 and to the rear plate 111, and which includes metal and/or polymer. In some embodiments, the rear plate 111 and the side bezel structure 118 may be formed integrally and may include the same material (for example, a metal material such as aluminum).

In the illustrated embodiment, the front plate 102 may include two first areas 110D on both ends of the long edge of the front plate 102 such that the two first areas 110D bend from the first surface 110A toward the rear plate 111 and extend seamlessly. In the illustrated embodiment (see FIG. 2), the rear plate 111 may include two second areas 110E on both ends of the long edge such that the two second areas 110E bend from the second surface 110B toward the front plate 102 and extend seamlessly. In some embodiments, the front plate 102 (or the rear plate 111) may include only one of the first areas 110D (or the second areas 110E). In another embodiment, a part of the first areas 110D or the second areas 110E may not be included. In the above embodiments, when seen from the side surface of the electronic device 100, the side bezel structure 118 may have a first thickness (or width) on a part of the side surface, which does not include the first areas 110D or the second areas 110E as described above, and may have a second thickness that is smaller than the first thickness on a part of the side surface, which includes the first areas 110D or the second areas 110E.

According to an embodiment, the electronic device 100 may include at least one of a display 101, audio modules 103, 107, and 114, sensor modules 104, 116, and 119, camera modules 105, 112, and 113, a key input device 117, a light-emitting element 106, and connector holes 108 and 109. In some embodiments, at least one of the constituent elements (for example, the key input device 117 or the light-emitting element 106) of the electronic device 100 may be omitted, or the electronic device 100 may additionally include another constituent element.

The display 101 may be exposed through a corresponding part of the front plate 102, for example. In some embodiments, at least a part of the display 101 may be exposed through the front plate 102 that forms the first areas 110D of the side surface 110C and the first surface 110A. In some embodiments, the display 101 may have a corner formed in substantially the same shape as that of the adjacent outer periphery of the front plate 102. In another embodiment (not illustrated), in order to increase the area of exposure of the display 101, the interval between the outer periphery of the display 101 and the outer periphery of the front plate 102 may be formed to be substantially identical.

In another embodiment (not illustrated), a recess or an opening may be formed in a part of the screen display area of the display 101, and at least one of an audio module 114, a sensor module 104, a camera module 105, and a light-emitting element 106 may be included and aligned with the recess or the opening. In another embodiment (not illustrated), on the back surface of the screen display area of the display 101, at least one of an audio module 114, a sensor module 104, a camera module 105, a fingerprint sensor 116, and a light-emitting element 106 may be included. In another embodiment (not illustrated), the display 101 may be coupled to or arranged adjacent to a touch sensing circuit, a pressure sensor capable of measuring the intensity (pressure) of a touch, and/or a digitizer that detects a magnetic field-type stylus pen. In some embodiments, at least a part of the sensor modules 104 and 119 and/or at least a part of the key input device 117 may be arranged in the first areas 110D and/or the second areas 110E.

The audio modules 103, 107, and 114 may include a microphone hole 103 and speaker holes 107 and 114. A microphone for acquiring an external sound may be arranged in the microphone hole 103, and a plurality of microphones may be arranged therein such that the direction of a sound can be sensed in some embodiments. The speaker holes 107 and 114 may include an outer speaker hole 107 and a speech receiver hole 114. In some embodiments, the speaker holes 107 and 114 and the microphone hole 103 may be implemented as a single hole, or a speaker may be included (for example, a piezoelectric speaker) without the speaker holes 107 and 114.

The sensor modules 104, 116, and 119 may generate an electric signal or a data value corresponding to the internal operating condition of the electronic device 100 or the external environment condition thereof. The sensor modules 104, 116, and 119 may include, for example, a first sensor module 104 (for example, a proximity sensor) arranged on the first surface 110A of the housing 110, and/or a second sensor module (not illustrated) (for example, a fingerprint sensor), and/or a third sensor module 119 (for example, an HRM sensor) arranged on the second surface 110B of the housing 110, and/or a fourth sensor module 116 (for example, a fingerprint sensor). The fingerprint sensor may be arranged not only on the first surface 110A (for example, the display 101) of the housing 110, but also on the second surface 110B thereof. The electronic device 100 may further include a sensor module not illustrated, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or a luminance sensor 104.

The camera modules 105, 112, and 113 may include a first camera device 105 arranged on the first surface 110A of the electronic device 100, a second camera device 112 arranged on the second surface 110B thereof, and/or a flash 113. The camera devices 105 and 112 may include a single lens or a plurality of lenses, an image sensor, and/or an image signal processor. The flash 113 may include, for example, a light-emitting diode or a xenon lamp. In some embodiments, two or more lenses (an infrared camera, a wide-angle lens, and a telephoto lens) and image sensors may be arranged on a single surface of the electronic device 100.

The key input device 117 may be arranged on the side surface 110C of the housing 110. In another embodiment, the electronic device 100 may not include a part of the above-mentioned key input device 117 or the entire key input device 117, and the key input device 117 (not included) may be implemented in another type, such as a soft key, on the display 101. In some embodiments, the key input device may include a sensor module 116 arranged on the second surface 110B of the housing 110.

The light-emitting element 106 may be arranged on the first surface 110A of the housing 110, for example. The light-emitting element 106 may provide information regarding the condition of the electronic device 100 in a light type, for example. In another embodiment, the light-emitting element 106 may provide a light source that interworks with operation of the camera module 105, for example. The light-emitting element 106 may include, for example, an LED, an IR LED, and a xenon lamp.

The connector holes 108 and 109 may include a first connector hole 108 capable of containing a connector (for example, a USB connector) for transmitting/receiving power and/or data to/from an external electronic device, and/or a second connector hole (for example, an earphone jack) 109 capable of containing a connector for transmitting/receiving an audio signal to/from the external electronic device.

Figure 3:
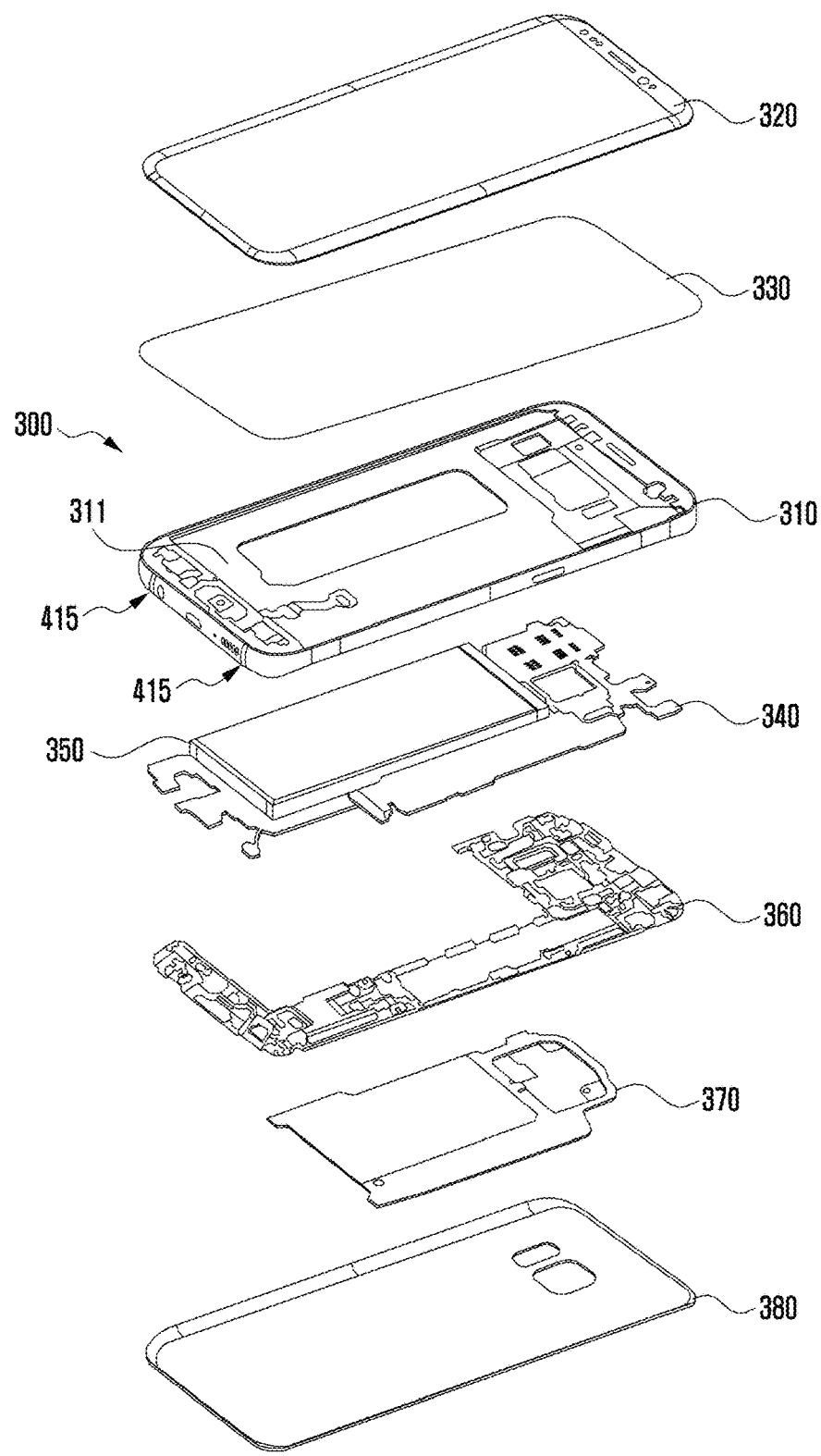
FIG. 3 is an exploded perspective view of the electronic device according to various embodiments of the present disclosure.

FIG. 3 is an exploded perspective view of the electronic device according to various embodiments of the present disclosure.

Referring to FIG. 3, the electronic device 300 may include a side bezel structure 310 (for example, a housing), a first support member 311 (for example, a bracket), a front plate 320, a display 330, a printed circuit board 340, a battery 350, a second support member 360 (for example, a rear case), an antenna 370, and a rear plate 380. In some embodiments, at least one of the constituent elements (for example, the first support member 311 or the second support member 360) of the electronic device 300 may be omitted, or the electronic device 300 may further include another constituent element. At least one of the constituent elements of the electronic device 300 may be identical or similar to at least one of the constituent elements of the electronic device 100 of FIG. 1 or FIG. 2, and repeated descriptions thereof will be omitted herein.

The first support member 311 may be arranged inside the electronic device 300 and connected to the side bezel structure 310, or may be formed integrally with the side bezel structure 310. The first support member 311 may be made of a metal material and/or a nonmetal (for example, polymer) material, for example. The display 330 may be coupled to one surface of the first support member 311, and the printed circuit board 340 may be coupled to the other surface thereof. A processor, a memory, and/or an interface may be mounted on the printed circuit board 340. The processor may include, for example, one or more of a central processing device, an application processor, a graphic processing device, an image signal processor, a sensor hub processor, or a communication processor.

The memory may include a volatile memory or a non-volatile memory, for example.

The interface may include, for example, a high definition multimedia interface (HDMI), a universal serial bus (USB) interface, an SD card interface, and/or an audio interface. The interface may connect the electronic device 300 with an external electronic device electrically or physically, for example, and may include a USB connector, an SD card/MMC connector, or an audio connector.

The battery 350 is a device for supplying power to at least one constituent element of the electronic device 300, and may include a non-rechargeable primary cell, a rechargeable secondary cell, or a fuel cell, for example. At least a part of the battery 350 may be arranged on substantially the same plane with the printed circuit board 340, for example. The battery 350 may be arranged integrally inside the electronic device 300, or may be arranged such that the same can be attached to/detached from the electronic device 300.

The antenna 370 may be arranged between the rear plate 380 and the battery 350. The antenna 370 may include, for example, a near field communication (NFC) antenna, a wireless charging antenna, and/or a magnetic secure transmission (MST) antenna. The antenna 370 may conduct near-field communication with an external device or may wirelessly transmit/receive power necessary for charging, for example. In another embodiment, an antenna structure may be formed by a part or a combination of the side bezel structure 310 and/or the first support member 311.

With reference to FIGS. 1 to 3, the housing 110 (or the side bezel structure 310) of the electronic device 100, 300) may be separated by using at least one non-conductive protrusion 415 and may be used as a plurality of antenna radiators.

Figure 4:
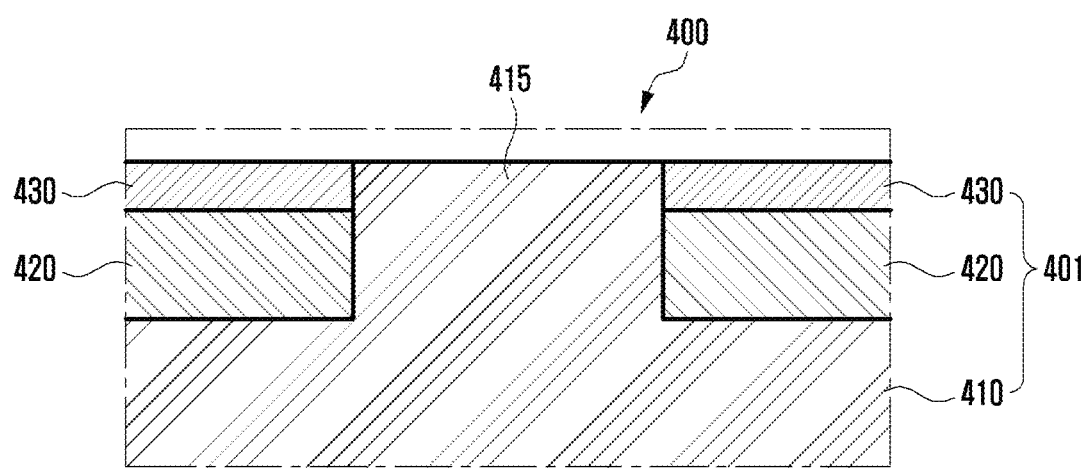
FIG. 4 is a cross-sectional view illustrating a part of the electronic device including a housing according to various embodiments of the present disclosure.
Figure 4:
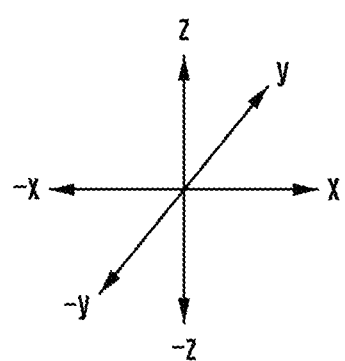

FIG. 4 is a cross-sectional view illustrating a part of the electronic device including a housing according to various embodiments of the present disclosure. FIG. 4 may be a cross-sectional view schematically illustrating part a-a' in FIG. 1.

According to various embodiments, a part of the electronic device 400 disclosed hereinafter may include a part of the electronic device 100, 300 disclosed in FIGS. 1 to 3. Embodiments of the electronic device 400 of FIG. 4 may include the embodiments disclosed in FIGS. 1 to 3.

Referring to FIG. 4, the electronic device 400 according to various embodiments of the present disclosure may include a housing 401, a non-conductive part 410, a conductive deposition layer 420, and/or a decoration layer 430.

According to an embodiment, the housing 401 may form an exterior of the electronic device 400. The housing 401 may include the non-conductive part 410, the conductive deposition layer 420, and/or the decoration layer 430.

According to various embodiments, the housing 401 may include the housing 110 of FIG. 1 or the side bezel structure 310 of FIG. 3.

According to an embodiment, the non-conductive part 410 may include a non-conductive protrusion 415 protruding upward (e.g., a z-axis direction) from at least some area (e.g., a central part) thereof.

According to various embodiments, the non-conductive part 410 and the non-conductive protrusion 415 may include a dielectric layer (e.g., an insulating material). For example, the non-conductive part 410 and the non-conductive protrusion 415 may include a polymer material.

According to an embodiment, the conductive deposition layer 420 may be disposed on a surface of the non-conductive part 410 except the top of the non-conductive protrusion 415. The conductive deposition layer 420 may be disposed on a top side of the non-conductive part 410 on a first side (e.g., an x axis direction) and second side (e.g., -x axis direction) of the non-conductive protrusion 415. The conductive deposition layers 420 disposed on the first side and second side of the non-conductive part 410 with respect to the non-conductive protrusion 415 may be used as the antenna radiators of the electronic device 400.

According to various embodiments, the conductive deposition layer 420 may include a conductive material. For example, the conductive deposition layer 420 may include aluminum (Al). The conductive deposition layer 420 may be made of high-purity aluminum (Al) in order to enable anodizing.

In another embodiment, the conductive deposition layer 420 may also include aluminum (Al), stainless steel (STS), titanium (Ti), and/or a metal mixture. In addition to the aforementioned materials, other various conductive materials may be used as the conductive deposition layer 420.

According to various embodiments, after the conductive deposition layer 420 is disposed on a surface of the non-conductive part 410, the conductive deposition layer 420 may be subjected to surface treatment by using at least one of blasting, buffing, etching, and polishing. Illuminance of a surface of the conductive deposition layer 420 may be adjusted by using a physical method (e.g., blasting) and/or a chemical method (e.g., etching). According to an embodiment, the conductive deposition layer 420 may include surface roughness having a range from about Ra 0.1 to 10 μm, for example, by using a physical method and/or a chemical method.

According to an embodiment, the decoration layer 430 may include an oxide-covered layer. The oxide-covered layer may be formed in the upper direction (e.g., a z-axis direction) of the conductive deposition layer 420 by using anodizing. The oxide-covered layer may be substituted with an electrode deposition layer.

According to various embodiments, the decoration layer 430 may include an electrode deposition layer. The electrode deposition layer may be formed in the upward direction (e.g., a z-axis direction) of the conductive deposition layer 420 by using electrode deposition. The electrode deposition layer may substitute the oxide-covered layer.

According to various embodiments, if the decoration layer 430 is an oxide-covered layer or an electrode deposition layer, an anti-fingerprint (AF) coating may be formed on the top (or top surface) of the non-conductive protrusion 415 protruded from some area (e.g., a central part) of the non-conductive part 410 and the top (or top surface) of the oxide-covered layer or the electrode deposition layer.

According to various embodiments, the decoration layer 430 may include a coating layer. The coating layer may be formed on the top of the non-conductive protrusion 415 protruded from some area (e.g., the central part) of the non-conductive part 410 and the top of the conductive deposition layer 420 by using coating. The coating layer may substitute an oxide-covered layer. The coating layer may be made of a non-conductive material (e.g., an insulating material).

According to various embodiments, if the decoration layer 430 is a coating layer, an anti-fingerprint (AF) coating may be formed on the top of the coating layer.

According to various embodiments, the decoration layer 430 may implement texture, such as metal, through an oxide-covered layer formed by using anodizing. In another embodiment, the decoration layer 430 may be substituted with at least one of an electrode deposition layer using electrode deposition or a coating layer using coating, and may implement texture, such as metal.

According to an embodiment, when the decoration layer 430 (e.g., an oxide-covered layer or an electrode deposition layer) is formed on the top surface of the conductive deposition layer 420, the decoration layer 430 may be constituted to have substantially the same height as the non-conductive protrusion 415 upward (e.g., a z-axis direction) protruded from the non-conductive part 410. The decoration layer 430 may be constituted to have substantially the same horizontal plane as the non-conductive protrusion 415. According to various embodiments, if the decoration layer 430 (e.g., a coating layer) is disposed on the top of the non-conductive protrusion 415 protruded from some area (e.g., the center) of the non-conductive part 410 and the top of the conductive deposition layer 420, the non-conductive protrusion 415 and the conductive deposition layer 420 may be constituted to have substantially the same height. The decoration layer 430 (e.g., a coating layer) may be constituted to have substantially the same horizontal plane.

Figure 5:
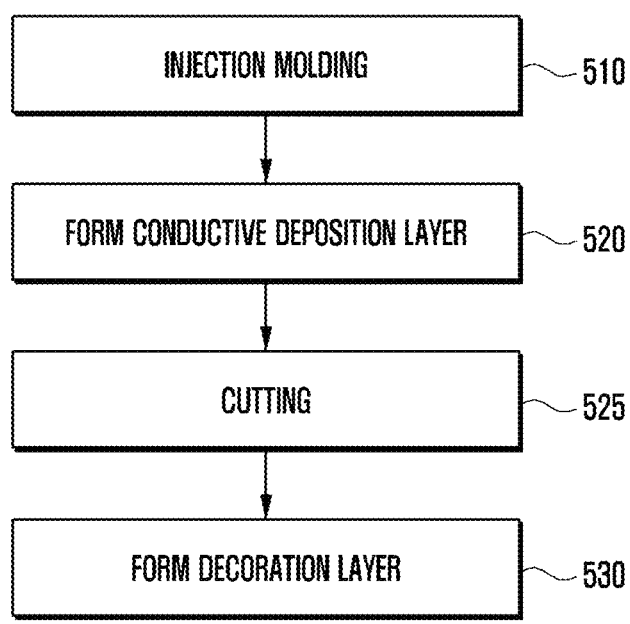
FIG. 5 is a process diagram illustrating a method of manufacturing the housing of the electronic device according to various embodiments of the present disclosure.
Figure 6:
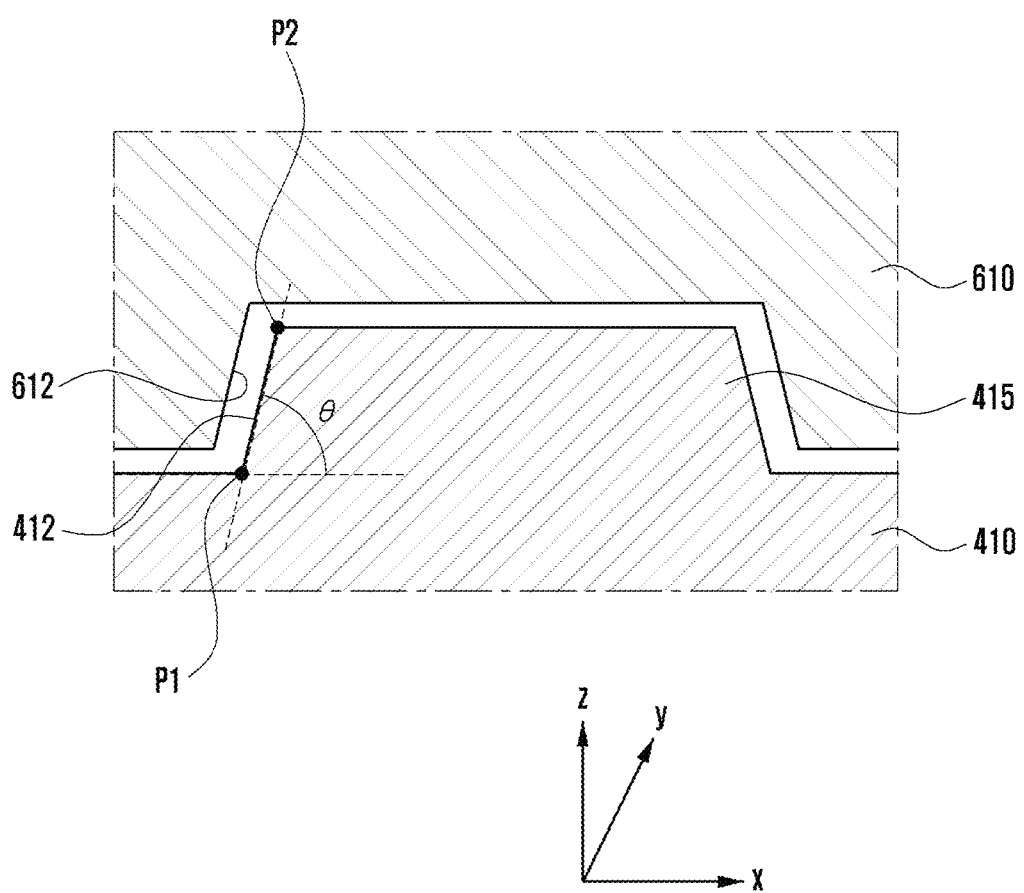
FIG. 6 is a diagram describing a mold and a non-conductive part according to various embodiments of the present disclosure.
Figure 7:
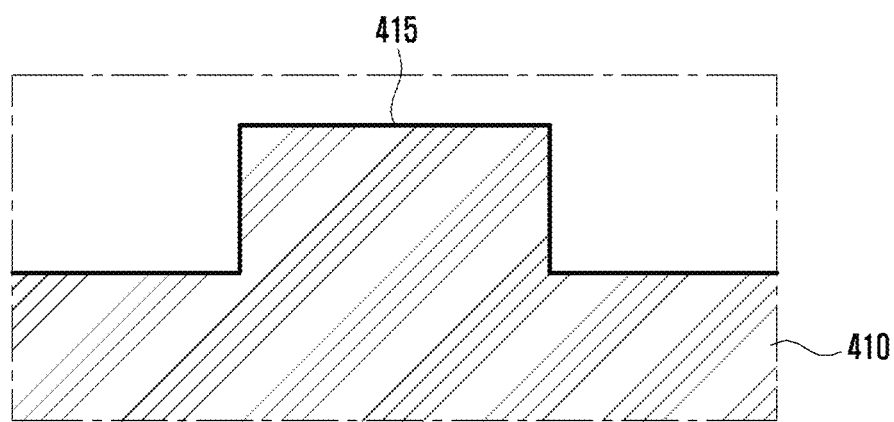
FIG. 7 is a diagram describing a non-conductive part with which a non-conductive protrusion has been integrated according to various embodiments of the present disclosure.

FIG. 5 is a process diagram illustrating a method of manufacturing the housing of the electronic device according to various embodiments of the present disclosure. FIG. 6 is a diagram describing a mold and the non-conductive part according to various embodiments of the present disclosure. FIG. 7 is a diagram describing the non-conductive part with which the non-conductive protrusion has been integrated according to various embodiments of the present disclosure.

Figure 8:
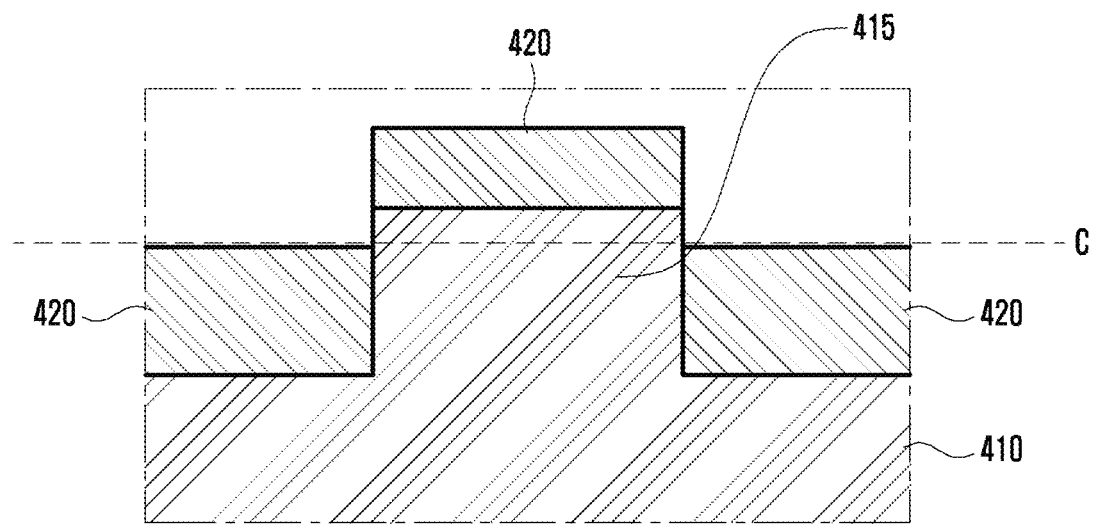
FIG. 8 a diagram describing a process of forming a conductive deposition layer on the non-conductive part according to various embodiments of the present disclosure.
Figure 9:
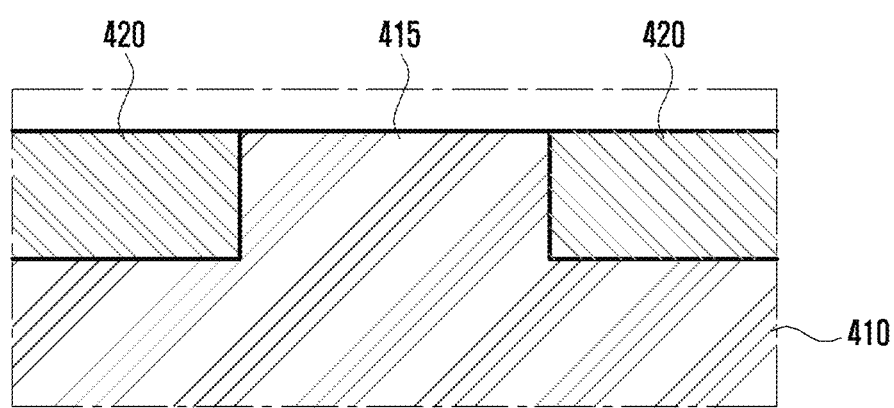
FIG. 9 is a diagram illustrating a state after the non-conductive part and a conductive deposition layer are processed according to various embodiments of the present disclosure.
Figure 10:
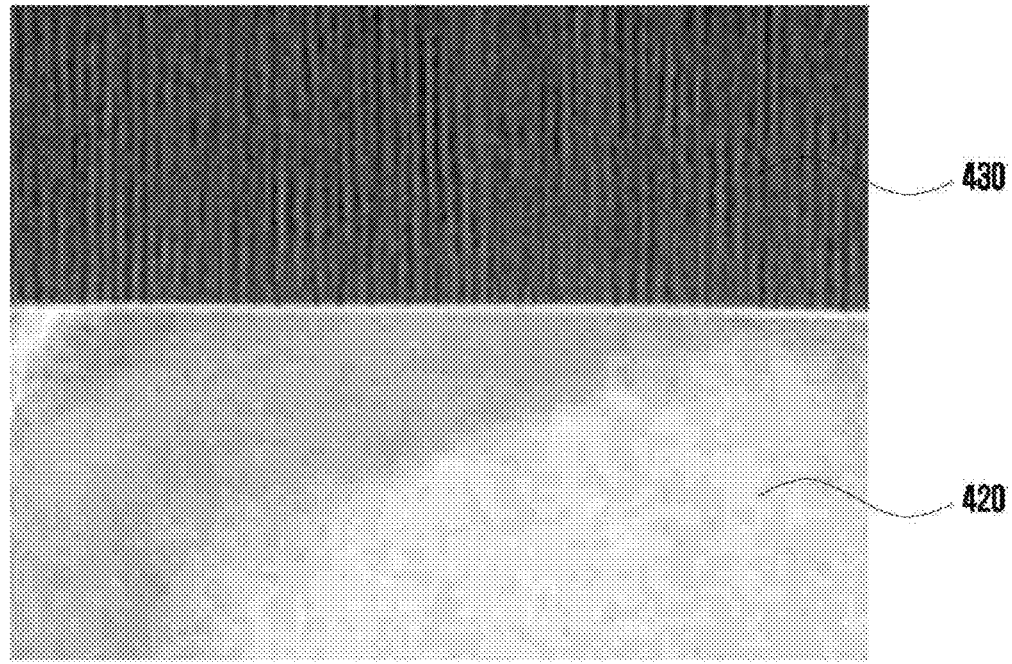
FIG. 10 is a diagram illustrating an embodiment in which a decoration layer (e.g., an oxide-covered layer) is formed on a surface of the conductive deposition layer according to various embodiments of the present disclosure.
Figure 11:
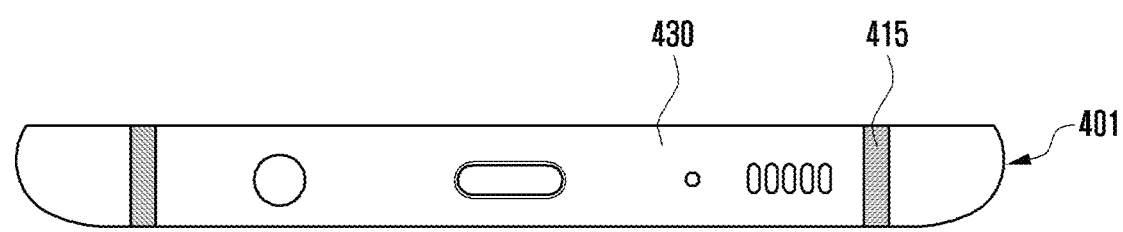
FIG. 11 is a diagram illustrating a part of the housing including the non-conductive part and the decoration layer (e.g., an oxide-covered layer) according to various embodiments of the present disclosure.

FIG. 8 a diagram describing a process of forming the deposition layer on the non-conductive part according to various embodiments of the present disclosure. FIG. 9 is a diagram illustrating a state after the non-conductive part and the conductive deposition layer are processed according to various embodiments of the present disclosure. FIG. 10 is a diagram illustrating an embodiment in which the decoration layer (e.g., an oxide-covered layer) is formed on a surface of the conductive deposition layer according to various embodiments of the present disclosure. FIG. 11 is a diagram illustrating a part of the housing including the non-conductive part and the decoration layer (e.g., an oxide-covered layer) according to various embodiments of the present disclosure.

In descriptions of FIGS. 5 to 11, a redundant description of the same construction and function as those of the embodiments disclosed in FIGS. 1 to 4 may be omitted. The embodiments disclosed in FIGS. 5 to 11 may be applied to the embodiments disclosed in FIGS. 1 to 4.

According to an embodiment, in a process 510, the non-conductive part 410 including the non-conductive protrusion 415 upward (e.g., a z-axis direction) protruded from at least some area (e.g., a central part) may be shaped or manufactured by using a mold 610.

According to various embodiments, the non-conductive protrusion 415 may be manufactured by cutting and processing the non-conductive part 410.

According to various embodiments, the non-conductive protrusion 415 protruding upward (e.g., a z-axis direction) from the non-conductive part 410 may be constituted to be higher than a surface of the conductive deposition layer 420 by taking into consideration that the non-conductive part 410 is partially cut and/or removed after deposition for forming the non-conductive part 410. For example, a top surface of the non-conductive protrusion 415 may be formed to be about in a range from 0.1 to 1.0 mm higher than the surface of the deposition layer 420.

According to various embodiments, a material having a heat deformation temperature higher than a deposition temperature (e.g., about a range from 150° C. to 180° C.) for forming the conductive deposition layer 420 may be used for the non-conductive part 410. For example, when the conductive deposition layer 420 is aluminum (Al), a process temperature for depositing aluminum (Al) is about a range from 150° C. to 180° C. In order to withstand a heat deformation for the process temperature, a polymer material, such as a PEAK (Polyaryletherketone), may be used for the non-conductive part 410.

With reference to FIG. 7, the non-conductive protrusion 415 may be upward (e.g., a z-axis direction) protruded from the non-conductive part 410 and integrated with the non-conductive part 410.

With reference to FIG. 6, the non-conductive part 410 with which the non-conductive protrusion 415 is integrated and coupled may be injected and shaped by using the mold 610. The mold 610 may have a shape corresponding to a shape of the non-conductive part 410 from which the non-conductive protrusion 415 has been protruded.

According to various embodiments, the non-conductive protrusion 415 protruding upward (e.g., a z-axis direction) from the non-conductive part 410 may have an inclined plane 412 inclined from a first point p1 to a second point p2, for example, in they axis direction. The inclined plane 412 may be at least partially formed on a first side and second side of the non-conductive protrusion 415. The mold 610 may include an inclined plane 612 corresponding to the inclined plane 412 formed in the non-conductive protrusion 415. The inclined plane 412 of the non-conductive protrusion 415 or the inclined plane 612 of the mold 610 may have a diagonal type. The inclined plane 412 of the non-conductive protrusion 415 and the inclined plane 612 of the mold 610 may form a subtraction gradient structure. For the subtraction gradient structure, the inner angle of the inclined plane of the non-conductive protrusion 415 may have an acute angle. For example, an inner angle of the inclined plane of the non-conductive protrusion 415 may have an angle of less than 90° (e.g., about 80° to about 89°) with respect to the x axis, that is, a horizontal direction. For example, an angle θ between the x-axis direction and the y-axis direction may be in a range from about 80° to about 89° near the first point p1, that is, a start point in the direction in which the top of the non-conductive protrusion 415 is protruded. In another embodiment, the angle of the inclined plane of the non-conductive protrusion 415 may have an obtuse angle only if the subtraction gradient structure can be formed. For example, the angle of the inclined plane of the non-conductive protrusion 415 may be an angle (e.g., about 91° to about 100°) greater than 90° with respect to the x axis, that is, the horizontal direction.

According to an embodiment, in a process 520, the conductive deposition layer 420 may be formed on the top of the non-conductive part 410 and the top of the non-conductive protrusion 415 by using deposition.

According to various embodiments, after the conductive deposition layer 420 is formed, a transparent thin film layer (e.g., a coating layer) may be further formed on the surface of the conductive deposition layer 420 in order to increase a fouling resistant property.

With reference to FIG. 8, the non-conductive protrusion 415 upward (e.g., a z-axis direction) protruded from the non-conductive part 410 may be formed to be about 0.1 to 1.0 mm higher than the surface of the conductive deposition layer 420 by taking into consideration that the non-conductive protrusion 415 is partially cut and/or removed after deposition for forming the conductive deposition layer 420.

According to an embodiment, in a process 525, a part of the top of the non-conductive protrusion 415 may be cut so that the top surface of the non-conductive protrusion 415 and the height of the conductive deposition layer 420 are substantially the same.

With reference to FIGS. 8 and 9, a part of the top of the non-conductive protrusion 415 may be cut and/or removed based on a cutting surface C, and the top surface of the non-conductive protrusion 415 and the height of the conductive deposition layer 420 may be formed to be substantially the same. In this case, a part of the top of the conductive deposition layer 420 may be at least partially cut in a way to have substantially the same height as the top surface of the non-conductive protrusion 415.

According to various embodiments, after the processing using the cutting, illuminance of the surface of the conductive deposition layer 420 may be adjusted by using a physical method (e.g., blasting) and/or a chemical method (e.g., etching). For example, the conductive deposition layer 420 may have surface roughness having a range of about Ra 0.1 to 10, μm by using a physical method and/or a chemical method.

According to an embodiment, in a process 530, the decoration layer 430 may be formed on the conductive deposition layer 420 disposed on the top surface of the non-conductive part 410. The decoration layer 430 may include one of an oxide-covered layer, an electrode deposition layer, and a coating layer.

According to various embodiments, when the decoration layer 430 is an oxide-covered layer, the oxide-covered layer may be formed by using anodizing. In another embodiment, when the decoration layer 430 is an electrode deposition layer, the electrode deposition layer may be formed by using electrode deposition. The electrode deposition layer may substitute the oxide-covered layer. In another embodiment, when the decoration layer 430 is the coating layer, the coating layer may be formed by using coating. The coating layer may substitute the oxide-covered layer. According to various embodiments, when the decoration layer 430 is the oxide-covered layer or the electrode deposition layer, anti-fingerprint (AF) coating is formed on the top of the non-conductive protrusion 415 protruded from some area (e.g., a central part) of the non-conductive part 410 and the top of the oxide-covered layer or the electrode deposition layer.

According to various embodiments, when the decoration layer 430 is the coating layer, the coating layer may be disposed on the top of the non-conductive protrusion 415 protruded from some area (e.g., the center) of the non-conductive part 410 and the top surface of the conductive deposition layer 420. An anti-fingerprint (AF) coating may be formed on the top of the coating layer.

Referring to FIG. 10, the decoration layer 430 (e.g., the oxide-covered layer may be formed by performing anodizing processing on the surface of the conductive deposition layer 420. For example, when the conductive deposition layer 420 is aluminum (Al), the decoration layer 430 (e.g., an oxide-covered layer) may implement texture, such as metal, by using anodizing.

According to an embodiment, since aluminum (Al) not including an intermetallic compound (e.g., $FeAl_3$, $CrAl_3$, $Fe_3SiAl_{12}$, $Cr_3SiAl_{12}$, $Mg_2Si$, $Mg(Zn_2AlCu)$, and/or $CrAl_{17}$) is used as the conductive deposition layer 420, pore (e.g., fine holes) shapes may be arranged in a straight line within the conductive deposition layer 420 when the anodizing is performed.

According to a comparison embodiment, when the conductive deposition layer 420 contains an intermetallic compound such as $FeAl_3$, $CrAl_3$, $Fe_3SiAl_{12}$, $Cr_3SiAl_{12}$, $Mg_2Si$, $Mg(Zn_2AlCu)$, and/or $CrAl_{17}$, for example, upon anodizing process, a speed and/or a direction at and/or in which a pore layer is formed may be changed. The conductive deposition layer 420 (e.g., high-purity aluminum) according to various embodiments of the present disclosure may have a pore layer having straightness and may be grown in a straight-line direction compared to the comparison embodiment when anodizing is performed because the conductive deposition layer 420 does not include an intermetallic compound (e.g., $FeAl_3$, $CrAl_3$, $Fe_3SiAl_{12}$, $Cr_3SiAl_{12}$, $Mg_2Si$, $Mg(Zn_2AlCu)$, and/or $CrAl_{17}$).

According to various embodiments, the decoration layer 430 (e.g., the oxide-covered layer) formed on the surface of the conductive deposition layer 420 by using anodizing may have a thickness of about a range from 1, μm to 5 μm, for example. For example, when the conductive deposition layer 420 has a thickness of about 45 μm, the decoration layer 430 (e.g., an oxide-covered layer) having a thickness of about a range from 1, μm to 5, μm may be formed on the surface of the conductive deposition layer 420 when anodizing is performed. In another embodiment, an additional decoration layer (e.g., an oxide-covered layer) having a thickness of about a range from 1, μm to 5, μm may be further included on the surface of the decoration layer 430.

With reference to FIGS. 4 and 11, the housing 401 manufactured according to various embodiments of the present disclosure is lightweight and may implement outward appearance having substantially the same texture as metal because the housing 401 has a structure in which the conductive deposition layer 420 and the decoration layer 430 are disposed on the surface of the non-conductive part 410. The housing 401 may implement a plurality of antenna radiators through a simple method because the non-conductive protrusion 415 is integrated with and protruded from the non-conductive part 410.

The electronic device 400 according to various embodiments of the present disclosure includes the housing 401 forming an exterior thereof. The housing 401 may include the non-conductive part 410 including the non-conductive protrusion 415 protruded from at least some area of the non-conductive part 410, the conductive deposition layer 420 disposed on the top surface of the non-conductive part 410 except on top of the non-conductive protrusion 415, and the decoration layer 430 formed on the top of the conductive deposition layer 420.

According to various embodiments, the decoration layer 430 may include one of an oxide-covered layer, an electrode deposition layer, and a coating layer.

According to various embodiments, anti-fingerprint coating may be formed on the top of the decoration layer 430.

According to various embodiments, when the decoration layer is the coating layer, the coating layer may be disposed on the top of the non-conductive protrusion and the top of the conductive deposition layer.

According to various embodiments, in the housing 401 of the electronic device 400, the top surface of the non-conductive protrusion 415 and the decoration layer 430 may be constituted to have substantially the same height.

According to various embodiments, the non-conductive protrusion 415 and the non-conductive part 410 may include a polymer material.

According to various embodiments, the conductive deposition layer 420 may include aluminum (Al), stainless steel (STS), titanium (Ti), and/or a metal mixture.

According to various embodiments, a surface of the conductive deposition layer 420 may be processed by using at least one of blasting, buffing, etching, and polishing.

According to various embodiments, surface illuminance of the conductive deposition layer 420 may be adjusted by using a physical method and/or a chemical method.

According to various embodiments, the coating layer may be made of a non-conductive material.

According to various embodiments, the non-conductive protrusion 415 is formed to at least partially have an inclined plane, and an inner angle of the inclined plane may be an acute angle or an obtuse angle.

According to various embodiments, the conductive deposition layer 420 disposed on the first side and second side of the non-conductive part 410 based on the non-conductive protrusion 415 may be used as antenna radiators.

A method of manufacturing the housing 401 of the electronic device 400 according to various embodiments of the present disclosure may include a process of manufacturing the non-conductive part 410 including the non-conductive protrusion 415 protruded from at least some area of the non-conductive part 410; a process of forming the conductive deposition layer 420 on the top of the non-conductive part 410 and the top of the non-conductive protrusion 415 by using deposition; a process of cutting a part of the top of the non-conductive protrusion 415 so that a top surface of the non-conductive protrusion 415 and the height of the conductive deposition layer 420 are substantially the same; and a process of forming the decoration layer 430 on the conductive deposition layer 420 formed on a top surface of the non-conductive part 410.

According to various embodiments, in the process of manufacturing, the non-conductive protrusion 415 protruded from the non-conductive part 410 may be constituted to be higher than a surface of the conductive deposition layer 420.

According to various embodiments, the non-conductive part 410 may include a material having a heat deformation temperature higher than a deposition temperature for forming the conductive deposition layer 420.

According to various embodiments, the non-conductive protrusion 415 is formed to at least partially have an inclined plane, and an inner angle of the inclined plane may be an acute angle or an obtuse angle.

According to various embodiments, the method may further include a process of processing a surface of the conductive deposition layer 420 by using at least one of blasting, buffing, etching, and polishing after the process of cutting a part of the top of the non-conductive protrusion 415.

According to various embodiments, the decoration layer 430 may include one of an oxide-covered layer, an electrode deposition layer, and a coating layer.

According to various embodiments, anti-fingerprint coating may be formed on the top of the decoration layer 430.

According to various embodiments, when the decoration layer 430 is the coating layer, the coating layer may be made of a non-conductive material and may be disposed on the top of the non-conductive protrusion 415 and the top of the conductive deposition layer 420.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
   a housing forming an outward appearance of the electronic device,
   wherein the housing comprises:
   a non-conductive part;
   a non-conductive protrusion protruded from at least some area of the non-conductive part;
   a conductive deposition layer disposed on a top surface of the non-conductive part; and
   a non-conductive decoration layer formed on a top surface of the conductive deposition layer,
   wherein the non-conductive protrusion is configured to penetrate the conductive deposition layer and the non-conductive decoration layer such that an end of the non-conductive protrusion is exposed to outside of the housing, and
   wherein at least a portion of the conductive deposition layer is used as antenna radiator.

2. The electronic device of claim 1, wherein the non-conductive decoration layer comprises one of an oxide-covered layer, an electrode deposition layer, and a coating layer.

3. The electronic device of claim 1, wherein an anti-fingerprint coating is formed on top of the non-conductive decoration layer.

4. The electronic device of claim 2, wherein, when the non-conductive decoration layer is the coating layer, the coating layer is disposed on the top of the non-conductive protrusion and the top of the conductive deposition layer.

5. The electronic device of claim 1, wherein a top surface of the non-conductive protrusion and the non-conductive decoration layer are constituted to have substantially an identical height.

6. The electronic device of claim 1, wherein the non-conductive protrusion part and the non-conductive part comprise a polymer material.

7. The electronic device of claim 1, wherein the conductive deposition layer comprises aluminum (Al), stainless steel (STS), titanium (Ti), or a metal mixture.

8. The electronic device of claim 1, wherein a surface of the conductive deposition layer is processed by using at least one of blasting, buffing, etching, and polishing.

9. The electronic device of claim 1, wherein a surface illuminance of the conductive deposition layer is adjusted by using a physical method or a chemical method.

10. The electronic device of claim 2, wherein the coating layer is made of a non-conductive material.

11. The electronic device of claim 1, wherein:
    the non-conductive protrusion is formed with an inclined plane, and
    an inner angle of the inclined plane is an acute angle or an obtuse angle.

12. A method of manufacturing a housing of an electronic device, comprising:

manufacturing a non-conductive part and a non-conductive protrusion protruded from at least some area of the non-conductive part;

forming a conductive deposition layer on a top surface of the non-conductive part by using deposition;

cutting a top surface of the non-conductive protrusion to a height of the conductive deposition layer; and forming a non-conductive decoration layer on the conductive deposition layer formed on the top surface of the non-conductive part, wherein the non-conductive protrusion is configured to penetrate the conductive deposition layer and the non-conductive decoration layer such that an end of the non-conductive protrusion is exposed to outside of the housing, and wherein at least a portion of the conductive deposition layer is used as antenna radiator.

13. The method of claim 12, wherein in manufacturing the non-conductive part, the non-conductive protrusion protrudes from the non-conductive part more than the height of the conductive deposition layer.

14. The method of claim 12, wherein the non-conductive part comprises a material having a heat deformation temperature higher than a deposition temperature for forming the conductive deposition layer.

15. The method of claim 12, wherein:
the non-conductive protrusion is formed to have an inclined plane, and
an inner angle of the inclined plane is an acute angle or an obtuse angle.

16. The method of claim 12, further comprising processing a surface of the conductive deposition layer by using at least one of blasting, buffing, etching, and polishing after cutting the non-conductive protrusion.

17. The method of claim 12, wherein the non-conductive decoration layer comprises one of an oxide-covered layer, an electrode deposition layer, and a coating layer.

18. The method of claim 12, wherein an anti-fingerprint coating is formed on top of the non-conductive decoration layer.

19. The method of claim 17, wherein when the non-conductive decoration layer is the coating layer, the coating layer is made of a non-conductive material and is disposed on the non-conductive protrusion and the conductive deposition layer.

* * * * *